US009629283B2

(12) United States Patent
Soong et al.

(10) Patent No.: US 9,629,283 B2
(45) Date of Patent: Apr. 18, 2017

(54) COMPRESSIBLE THERMALLY CONDUCTIVE ARTICLES

(71) Applicant: Rogers Corporation, Rogers, CT (US)

(72) Inventors: Sharon Soong, Natick, MA (US); Ian Smith, Danielson, CT (US)

(73) Assignee: ROGERS CORPORATION, Rogers, CT (US)

( * ) Notice: Subject to any disclaimer, the term of this patent is extended or adjusted under 35 U.S.C. 154(b) by 0 days.

(21) Appl. No.: 14/296,504

(22) Filed: Jun. 5, 2014

(65) Prior Publication Data

US 2015/0359134 A1 Dec. 10, 2015

(51) Int. Cl.
*H05K 7/20* (2006.01)
*H05K 1/02* (2006.01)
*C08J 9/12* (2006.01)
*C08J 9/06* (2006.01)
*C09K 5/14* (2006.01)
*H01L 23/373* (2006.01)

(52) U.S. Cl.
CPC .............. *H05K 7/2039* (2013.01); *C08J 9/06* (2013.01); *C08J 9/12* (2013.01); *C09K 5/14* (2013.01); *H01L 23/3737* (2013.01); *H05K 1/0203* (2013.01); *C08J 2205/05* (2013.01); *H01L 2924/0002* (2013.01)

(58) Field of Classification Search
CPC ........ F28F 3/00; C08J 9/0061; C08J 2375/04; Y10T 428/218
See application file for complete search history.

(56) References Cited

U.S. PATENT DOCUMENTS

| | | |
|---|---|---|
| 2,591,884 A | 4/1952 | Simon et al. |
| 2,602,783 A | 7/1952 | Simon et al. |
| 2,621,166 A | 12/1952 | Schmidt et al. |
| 2,698,838 A | 1/1955 | Simon et al. |
| 2,729,618 A | 1/1956 | Muller et al. |
| 2,779,689 A | 1/1957 | Reis, Jr. |
| 2,808,391 A | 10/1957 | Pattison |
| 2,811,493 A | 10/1957 | Simon et al. |
| 2,833,730 A | 5/1958 | Barthel |

(Continued)

FOREIGN PATENT DOCUMENTS

| | | |
|---|---|---|
| EP | 2133913 A1 | 12/2009 |
| EP | 2551324 A1 | 1/2013 |
| GB | 733624 | 3/1953 |

OTHER PUBLICATIONS

Patent Abstracts of Japan; Publication No. 54-102516; Date of Publication Aug. 13, 1979; Application No. 53-008735; Date of Filing: Jan. 27, 1978; Electric Shock Preventing Apparatus for High Voltage Equipment.

(Continued)

*Primary Examiner* — Hai Vo
(74) *Attorney, Agent, or Firm* — Cantor Colburn LLP

(57) ABSTRACT

A compressible thermally conductive sheet comprises a plurality of through holes in a foam material substantially connecting first and second heat transfer surfaces to provide thermal pathways between surfaces. The though holes are filled with a non-foam thermally conductive composition in which thermally-conductive particulate filler is dispersed in a polymeric matrix. Also disclosed is a heat management assembly comprising the compressible thermally conductive sheet.

25 Claims, 2 Drawing Sheets

Thick coating to create highly filled, continuous silicone layers on both surfaces.

(56) References Cited

U.S. PATENT DOCUMENTS

| | | |
|---|---|---|
| 2,846,458 A | 8/1958 | Haluska |
| 2,850,476 A | 9/1958 | Seegar et al. |
| 2,866,762 A | 12/1958 | Brochhagen et al. |
| 2,866,774 A | 12/1958 | Price |
| 2,868,824 A | 1/1959 | Haluska |
| 2,870,097 A | 1/1959 | Brayton |
| 2,877,212 A | 3/1959 | Seligman |
| 2,878,601 A | 3/1959 | Burmeister et al. |
| 2,902,473 A | 9/1959 | Smith |
| 2,911,390 A | 11/1959 | Smith |
| 2,917,480 A | 12/1959 | Bailey et al. |
| 2,921,915 A | 1/1960 | Brochhagen et al. |
| 2,962,524 A | 11/1960 | Hostettler et al. |
| 3,021,309 A | 2/1962 | Cox et al. |
| 3,021,317 A | 2/1962 | Cox et al. |
| 3,057,901 A | 10/1962 | Plueddemann |
| 3,169,945 A | 2/1965 | Hostettler et al. |
| 3,383,351 A | 5/1968 | Stamberger |
| 5,733,945 A | 3/1998 | Simpson |
| 6,577,504 B1 * | 6/2003 | Lofland ............... H01L 23/3672 165/185 |
| 6,591,897 B1 | 7/2003 | Bhatti et al. |
| 6,784,363 B2 * | 8/2004 | Jones ................... H05K 9/0015 174/351 |
| 2003/0017320 A1 | 1/2003 | Ebihara et al. |
| 2005/0173145 A1 * | 8/2005 | Ohtsuka ............... H05K 9/0015 174/388 |
| 2011/0155945 A1 | 6/2011 | Soong |
| 2012/0048528 A1 | 3/2012 | Bergin et al. |
| 2012/0133072 A1 * | 5/2012 | Bunyan ................... C08L 83/04 264/104 |

OTHER PUBLICATIONS

Patent Cooperation Treaty; International Searching Authority; Search Report; PCT/US2015/032793; Date of mailing: Sep. 11, 2015; 5 pages.

Patent Cooperation Treaty; International Searching Authority; Written Opinion; PCT/US2015/032793; Date of mailing: Sep. 11, 2015; 5 pages.

* cited by examiner

Perforated foam (1MM holes/m2) with a thin coating.

Thin coating with wider perforation pattern (500k holes/m2).

Thick coating to create highly filled, continuous silicone layers on both surfaces.

COMPRESSIBLE THERMALLY CONDUCTIVE ARTICLES

BACKGROUND

Disclosed herein are thermally conductive foam products. The invention is useful for providing heat management in electronic devices.

Circuit designs for electronic devices such as televisions, radios, computers, medical instruments, business machines, communications equipment, and the like have become increasingly smaller and thinner. Smaller electronic components are being densely packed into ever smaller areas. Also, the increasing power of such devices has resulted in the need to squeeze more power into smaller space. Thus, manufacturers are continuously facing the challenge of dissipating the heat generated within such electronic devices Accordingly, novel designs for thermal management, to dissipate the heat from electronic devices, have been developed. For example, U.S. Pat. No. 6,591,897 discloses a heat sink for electronic devices with a plurality of columnar pins, for conducting heat from a spreader plate, that are mounted on a top surface of the spreader plate. A foam block is mounted on the spreader plate and surrounds the columnar pins. The foam material, however, is used primarily for heat transfer rather than for compressibility U.S. Patent Pub. No. 2012/0048528 discloses a compressible, thermally conductive foam pad that is coated, molded or extruded and filled with ceramic fillers, such as $Al_2O_3$ or BN (boron nitride) particles, in an amount of between about 20% and 80% of the total weight of the foam pad. The foam pad can be selected from various elastomeric materials, including silicon or polyurethane. Due to the thickness of the pad, air-filled through holes (vias) are provided in the pad to provide further compressibility. The presence of a plurality of vias provides for the compression of the normally incompressible product when subjected to an external force or load. It has been found that as the load on the thermal interface increases, the void volume decreases, resulting in increasing thermal conductivity with increasing load. The foam can have a thermal conductivity of at least 0.5 W/m-K.

Despite the variety of materials and designs that have been proposed for use in thermal management, as exemplified by the foregoing, it is apparent that there is a continued desire for new and improved thermal management materials for use by electronics manufacturers.

Accordingly, it is an objective of the present invention to provide an improved thermal management product for electronic devices and other applications. The product should have excellent heat transfer efficiency and heat dissipation in combination with conformability and compact size as necessary for a particular application. The product should also be capable of advantageous manufacture.

SUMMARY

The present invention relates to a compressible thermally conductive product adapted to be disposed between two heat transfer surfaces, for example that the heat transfer surface of an electronic component and of a heat sink, thereby providing a thermal pathway between the surfaces. A thermal management assembly can comprise such a product in contact with two heat transfer surfaces.

In one embodiment, a compressible thermally conductive sheet, having a first and second heat transfer surface and a plurality of through holes connecting the first and second heat transfer surfaces to provide a thermal pathway there between, comprises a foamed polymeric pad having through holes that are filled with a non-foamed thermally conductive composition comprising thermally conductive particulate filler dispersed in a polymeric matrix.

In another embodiment, a compressible thermally conductive sheet having a first and second heat transfer surface and a plurality of through holes substantially transverse to the first and second heat transfer surfaces to provide a thermal pathway there between, comprises a foam polymeric pad having through holes that are filled with a non-foamed thermally conductive composition comprising about 20% to 80% by weight of dispersed thermally-conductive particulate filler, wherein the particulate filler is selected from the group consisting of metal and non-metal oxides, nitrides, carbides, diboride particles, graphite particles, metal particles, and combinations thereof, having on average a thermal conductivity of 25 to 500 W/mK, wherein the particular filler is dispersed in a polymeric matrix comprising the reaction product of two silicone resins; and wherein the compressible thermally-conductive sheet has a thermal conductivity that is at least 0.75 W/m-K.

The invention is also directed to an assembly including the thermal interface, a first heat transfer surface contacting one surface of the thermal interface, and a second heat transfer surface contacting a second opposed surface of the thermal interface.

The above described and other features are exemplified by the following figures and detailed description.

DETAILED DESCRIPTION

Figure 1:
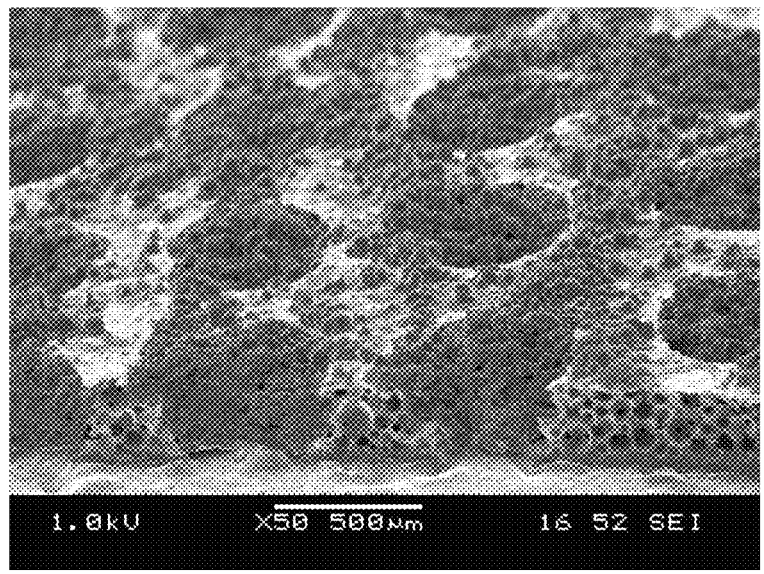
FIG. 1 shows an SEM (Scanning Electronic Microscope) image of one embodiment of a compressible thermally conductive sheet according to Example 1 herein, wherein the a foam pad has been perforated with $1\times10^6$ holes/m² and in which a thin coating is provided over the surfaces of the sheet.

A compressible thermally conductive sheet is obtained by perforating a compressible foam pad (also referred to as a substrate or foam layer) and filling the perforated through holes (or "vias") with a polymeric composition or polymer blend having high thermal conductivity, thereby providing z-axis thermal conductivity. Both top and bottom surfaces can also be coated with a thermally conductive polymer blend, so that the sheet material will also be thermally conductive in the x-y or plane direction.

The sheet material has the benefit of retaining compressibility and compression set properties of the foam substrate while significantly improving thermal conductivity. For example, the foam substrate before making the through holes may have an initial thermal conductivity of 0.01 W/mK to 0.2 W/mK, which can be considered characteristic of that of an insulator. By providing filled through holes, as described herein, the thermal conductivity can be improved to above 0.5 W/mK, specifically above 1 W/mK.

In one embodiment, a heat management assembly comprises two heat transfer surfaces, a first heat transfer surfaces that is a heat generating surface, specifically part of an electronic component, and a second heat transfer surface that is part of a thermal dissipation element, for example, a heat sink or circuit board.

The sheet material can be formed by casting, extrusion, molding, or other conventional process. The through holes can be stamped, punched, die-cut, or otherwise processed into the sheet. In the production of commercial quantities, the sheet can be cut from larger sheets or roll stock. Specifically, the compressible thermally conductive sheet can be conveniently prepared from the solid foam sheet material by punching a plurality of through holes completely through the sheet with a cutting tool or die, and subsequently removing the chads. Alternatively, a plurality of through holes can be molded into the pad during the pad manufacturing operation. Other methods for preparing the foam pads of the present invention will be readily apparent to those skilled in the art.

Since the foam pad is compressible, it readily conforms to first and second heat transfer surfaces, whether these surfaces are regular or irregular in shape. As the sheet is compressed, the thermal conductivity increases, thereby enhancing the heat transfer from the electronic device to the heat sink. This can be used to provide the necessary thermal management for a particular application, wherein temperature-sensitive elements in an electronic device can be maintained within a prescribed operating temperature in order to avoid significant performance degradation or even system failure.

The through holes can extend substantially through the thickness (Z-dimension) of the sheet in an at least partial transverse direction, specifically perpendicular to the plane of the opposing surfaces of the sheet which contact the two heat transfer surfaces. The sheet can be substantially flat or can have an irregular surface as will provide the best contact with the heat transfer surfaces it is intended to contact.

The through holes can have various cross-sectional geometries. Each of the through holes can have an inner peripheral surface which may be generally cylindrical with a generally circular, elliptical, oval triangular, square polygonal, or other closed geometric cross-section. Specifically, the through holes can be cylindrical. The diameter or shape of the through holes can be constant or can vary in the z-direction. The through holes can be regularly, i.e., uniformly spaced, or irregularly, i.e., non-uniformly spaced, distributed, and for most applications will have a diameter (or equivalent diameter) of between about 0.5 to 5 mm, specifically 0.3 to 2 mm. In this regard, the foam pad, by appropriate predetermined separation of the vias in the x and y directions, can have a total through-hole density of between about 100,000 holes/m$^2$ and 2 million holes/m$^2$, specifically 250,000 holes/m$^2$ and 1,250,000 holes m$^2$.

The non-foamed thermally conductive composition for filling the foam pad can comprise thermally conductive particles, in a polymer matrix, in a proportion sufficient to provide the thermal conductivity desired for the intended application. Generally the loading can be in an amount of from about 15% to about 90% by weight, specifically 25% to 80, more specifically 30 to 70%, most specifically 40 to 60% by weight of thermally conductive filler particles. In one embodiment, the particles can advantageously be incorporated into a silicone composition using any number of conventional techniques well known in the art, such as by compounding, blending, etc.

The size and shape of the filler particles is not critical for the purposes of the present invention. In this regard, the filler particles can be of any particulate shape, including solid or hollow spherical or microspherical flakes, platelets, irregular or fibrous shapes, specifically a powder for obtaining uniform dispersal and homogeneous mechanical and thermal properties. The particle size or distribution of the filler typically can range from between about 0.01 mil to about 10 mil, specifically 10 to 500 micrometers, more specifically 30 to 300 micrometers, most specifically 50 to 200 micrometers (μm), which refers to a mean diameter or equivalent diameter as best determined by standard laser particle measurement.

Thermally-conductive particulate fillers can include metal and non-metal oxides, nitrides, carbides, borides, graphite, and metal particles, and mixtures thereof, and more particularly boron nitride (BN), titanium diboride, aluminum nitride, silicon carbide, graphite, metals such as silver, aluminum, and copper, metal oxides such as aluminum oxide, magnesium oxide, zinc oxide, beryllium oxide, antimony oxide, and mixtures thereof. Ceramic materials are included. Such fillers characteristically exhibit a thermal conductivity of at least about 20 W/m-K. For reasons of economy, an aluminum oxide, i.e., alumina, can be used, while for reasons of improved thermal conductivity a boron nitride may be preferred. Specifically, the filler can comprise BN particles.

In one embodiment, a foam pad having through holes loaded with a non-foamed thermally conductive composition comprising thermally-conductive filler can exhibit a thermal conductivity, per ASTM D5470, of at least about 0.5 W/m-K, specifically 1 W/m-K, which can vary depending upon the thickness of the pad and other details of the material and its design.

The compressible thermally conductive sheet product can be used with electronic equipment by positioning it intermediate a first heat transfer surface and a second heat transfer surface to provide a thermal pathway there between. One heat transfer surface can be a component designed to absorb heat, such as a heat sink or an electronic circuit board. The other (opposed) heat transfer surface can be a heat generating source, such as a heat generating electronic component. Thus, the surface of the compressible thermally conductive sheet can be generally planar, multi-planar, curved, or complex curved, indented, etc. For many applications, the foam pad thickness may be between about 0.1 mm and 25 mm, specifically 0.25 to 15 mm or 10-1000 mils (0.254-25.4 mm), and typically, but not necessarily, will be small relative to the extents of the lengthwise or widthwise dimensions of foam pad as defined along the x- and y-axes.

As used herein, "foams" refers to materials having a cellular structure. Suitable foams have densities lower than about 65 pounds per cubic foot (pcf), specifically less than or equal to about 55 pcf, more specifically not more than 25 pcf, and/or a void volume content of at least about 20 to about 99%, specifically greater than or equal to about 30%, based upon the total volume of the polymeric foam. In one embodiment, the foam has a density of about 5 to about 30 pounds per cubic foot (lb/ft$^3$) (about 80 to about 481 kg/m$^3$), a 25% compression force deflection (CFD) about 0.5 to about 20 lb/in$^2$ (about 0.3 to about 1.41 kg/m$^2$), and a compression set at about 70° F. (21° C.) of less than about 10%, specifically less than 5%.

Polymers for use in the foams can be selected from a wide variety of thermoplastic resins, blends of thermoplastic resins, or thermosetting resins. Examples of thermoplastic resins that can be used include polyacetals, polyacrylics, styrene acrylonitrile, polyolefins, acrylonitrile-butadiene-styrene, polycarbonates, polystyrenes, polyethylene terephthalates, polybutylene terephthalates, polyamides such as, but not limited to Nylon 6, Nylon 6,6, Nylon 6,10, Nylon 6,12, Nylon 11 or Nylon 12, polyamideimides, polyarylates, polyurethanes, ethylene propylene rubbers (EPR), polyarylsulfones, polyethersulfones, polyphenylene sulfides, polyvinyl chlorides, polysulfones, polyetherimides, polytetrafluoroethylenes, fluorinated ethylene propylenes, polychlorotrifluoroethylenes, polyvinylidene fluorides, polyvinyl fluorides, polyetherketones, polyether etherketones, polyether ketone ketones, and the like, or a combination comprising at least one of the foregoing thermoplastic resins.

Examples of blends of thermoplastic resins that can be used in the polymer foams include acrylonitrile-butadiene-styrene/nylon, polycarbonate/acrylonitrile-butadiene-styrene, acrylonitrile butadiene styrene/polyvinyl chloride, polyphenylene ether/polystyrene, polyphenylene ether/nylon, polysulfone/acrylonitrile-butadiene-styrene, polycarbonate/thermoplastic urethane, polycarbonate/polyethylene terephthalate, polycarbonate/polybutylene terephthalate, thermoplastic elastomer alloys, polyethylene terephthalate/polybutylene terephthalate, styrene-maleic anhydride/acrylonitrile-butadiene-styrene, polyether etherketone/polyethersulfone, styrene-butadiene rubber, polyethylene/nylon, polyethylene/polyacetal, ethylene propylene rubber (EPR), and the like, or a combination comprising at least one of the foregoing blends.

Examples of polymeric thermosetting resins that can be used in the polymer foams include polyurethanes, epoxies, phenolics, polyesters, polyamides, silicones, and the like, or a combination comprising at least one of the foregoing thermosetting resins. Blends of thermosetting resins as well as blends of thermoplastic resins with thermosetting resins can be used.

In one embodiment, the foam pad comprises a polyurethane foam, such as an open cell, low modulus polyurethane foam, which can have an average cell size of about 50 to 250 μm, as may be measured, for example, in accordance with ASTM D 3574-95, a density of between about 5-30 lbs/ft$^3$, specifically 6 to 25 lbs/ft$^3$, a compression set of less than about 10%, and a force-deflection of between about 1-9 psi (7-63 kPa). Such materials are marketed under the name Poron®4700 by the Rogers Corporation, Woodstock, Conn. PORON® foams have been formulated to provide an excellent range of properties, including compression set resistance. Foams with good compression set resistance provide cushioning, and maintain their original shape or thickness under loads for extended periods.

Additional thermally conductive fillers and/or conductive polymers can be included in the formulation of the polyurethane foam pad depending upon the requirements of the particular application envisioned. Typically, these fillers and additives can be blended or otherwise admixed with the formulation, and may comprise between about 0.05-80% or more by total volume thereof.

A polyurethane foam pad can be manufactured mechanically and/or chemically (e.g., by physical blowing (e.g., mechanically frothing), chemical blowing, as well as combinations comprising at least one of the foregoing). For example, a polymer mixture can be mechanically frothed followed by curing, after which the foams can be formed into sheets by casting.

In general, polyurethane foams can be formed from reactive compositions comprising an organic isocyanate component reactive with an active hydrogen-containing component(s), a surfactant, and a catalyst. The organic isocyanate components used in the preparation of polyurethane foams generally comprises polyisocyanates having the general formula $Q(NCO)_i$, wherein "i" is an integer having an average value of greater than two, and Q is an organic radical having a valence of "i". Q can be a substituted or unsubstituted hydrocarbon group (e.g., an alkane or an aromatic group of the appropriate valency). Q can be a group having the formula $Q^1$-Z-$Q^1$ wherein $Q^1$ is an alkylene or arylene group and Z is —O—, —O-$Q^1$-S, —CO—, —S—, —S-$Q^1$-S—, —SO— or —SO$_2$—. Exemplary isocyanates include hexamethylene diisocyanate, 1,8-diisocyanato-p-methane, xylyl diisocyanate, diisocyanatocyclohexane, phenylene diisocyanates, tolylene diisocyanates, including 2,4-tolylene diisocyanate, 2,6-tolylene diisocyanate, and crude tolylene diisocyanate, bis(4-isocyanatophenyl)methane, chlorophenylene diisocyanates, diphenylmethane-4,4'-diisocyanate (also known as 4,4'-diphenyl methane diisocyanate, or MDI) and adducts thereof, naphthalene-1,5-diisocyanate, triphenylmethane-4,4',4''-triisocyanate, isopropylbenzene-alpha-4-diisocyanate, polymeric isocyanates such as polymethylene polyphenylisocyanate, and combinations comprising at least one of the foregoing isocyanates.

Q can also represent a polyurethane radical having a valence of "i", in which case $Q(NCO)_i$ is a composition known as a prepolymer. Such prepolymers are formed by reacting a stoichiometric excess of a polyisocyanate as set forth hereinbefore and hereinafter with an active hydrogen-containing component as set forth hereinafter, especially the polyhydroxyl-containing materials or polyols described below. Usually, for example, the polyisocyanate is employed in proportions of about 30 percent to about 200 percent stoichiometric excess, the stoichiometry being based upon equivalents of isocyanate group per equivalent of hydroxyl in the polyol. The amount of polyisocyanate employed will vary slightly depending upon the nature of the polyurethane being prepared.

The active hydrogen-containing component can comprise polyether polyols and polyester polyols. Exemplary polyester polyols are inclusive of polycondensation products of polyols with dicarboxylic acids or ester-forming derivatives thereof (such as anhydrides, esters and halides), polylactone polyols obtainable by ring-opening polymerization of lactones in the presence of polyols, polycarbonate polyols obtainable by reaction of carbonate diesters with polyols, and castor oil polyols. Exemplary dicarboxylic acids and derivatives of dicarboxylic acids which are useful for producing polycondensation polyester polyols are aliphatic or cycloaliphatic dicarboxylic acids such as glutaric, adipic, sebacic, fumaric and maleic acids; dimeric acids; aromatic dicarboxylic acids such as phthalic, isophthalic and terephthalic acids; tribasic or higher functional polycarboxylic acids such as pyromellitic acid; as well as anhydrides and second alkyl esters, such as maleic anhydride, phthalic anhydride and dimethyl terephthalate.

Additional active hydrogen-containing components are the polymers of cyclic esters. The preparation of cyclic ester polymers from at least one cyclic ester monomer is well documented in the patent literature as exemplified by U.S. Pat. Nos. 3,021,309 through 3,021,317; 3,169,945; and 2,962,524. Exemplary cyclic ester monomers include δ-valerolactone; ε-caprolactone; zeta-enantholactone; and the monoalkyl-valerolactones (e.g., the monomethyl-, monoethyl-, and monohexyl-valerolactones). In general the polyester polyol can comprise caprolactone based polyester polyols, aromatic polyester polyols, ethylene glycol adipate based polyols, and combinations comprising at least one of the foregoing polyester polyols, and especially polyester polyols made from ε-caprolactones, adipic acid, phthalic anhydride, terephthalic acid and/or dimethyl esters of terephthalic acid.

The polyether polyols are obtained by the chemical addition of alkylene oxides (such as ethylene oxide, propylene oxide, and so forth, as well as combinations comprising at least one of the foregoing), to water or polyhydric organic components (such as ethylene glycol, propylene glycol, trimethylene glycol, 1,2-butylene glycol, 1,3-butanediol, 1,4-butanediol, 1,5-pentanediol, 1,2-hexylene glycol, 1,10-decanediol, 1,2-cyclohexanediol, 2-butene-1,4-diol, 3-cyclohexene-1,1-dimethanol, 4-methyl-3-cyclohexene-1,1-dimethanol, 3-methylene-1,5-pentanediol, diethylene glycol, (2-hydroxyethoxy)-1-propanol, 4-(2-hydroxyethoxy)-1-butanol, 5-(2-hydroxypropoxy)-1-pentanol, 1-(2-hydroxymethoxy)-2-hexanol, 1-(2-hydroxypropoxy)-2-octanol, 3-allyloxy-1,5-pentanediol, 2-allyloxymethyl-2-methyl-1,3-propanediol, [4,4-pentyloxy)-methyl]-1,3-propanediol, 3-(o-propenylphenoxy)-1,2-propanediol, 2,2'-diisopropylidenebis(p-phenyleneoxy)diethanol, glycerol, 1,2,6-hexanetriol, 1,1,1-trimethylolethane, 1,1,1-trimethylolpropane, 3-(2-hydroxyethoxy)-1,2-propanediol, 3-(2-hydroxypropoxy)-1,2-propanediol, 2,4-dimethyl-2-(2-hydroxyethoxy)-methylpentanediol-1,5; 1,1,1-tris[2-hydroxyethoxy)methyl]-ethane, 1,1,1-tris[2-hydroxypropoxy)-methyl]propane, diethylene glycol, dipropylene glycol, pentaerythritol, sorbitol, sucrose, lactose, alpha-methylglucoside, alpha-hydroxyalkylglucoside, novolac resins, phosphoric acid, benzenephosphoric acid, polyphosphoric acids such as tripolyphosphoric acid and tetrapolyphosphoric acid, ternary condensation products, and so forth, as well as combinations comprising at least one of the foregoing). The alkylene oxides employed in producing polyoxyalkylene polyols normally have 2 to 4 carbon atoms. Propylene oxide and mixtures of propylene oxide with ethylene oxide are preferred. The polyols listed above can be used per se as the active hydrogen component.

A useful class of polyether polyols is represented generally by the following formula: $R[(OCH_nH_{2n})_zOH]_a$ wherein R is hydrogen or a polyvalent hydrocarbon radical; "a" is an integer equal to the valence of R, "n" in each occurrence is an integer of 2 to 4 inclusive (specifically, 3), and "z" in each occurrence is an integer having a value of 2 to 200, or, more specifically, 15 to 100. Desirably, the polyether polyol comprises a mixture of one or more of dipropylene glycol, 1,4-butanediol, and 2-methyl-1,3-propanediol, and so forth.

Another type of active hydrogen-containing materials that can be used is polymer polyol compositions obtained by polymerizing ethylenically unsaturated monomers in a polyol as described in U.S. Pat. No. 3,383,351. Exemplary monomers for producing such compositions include acrylonitrile, vinyl chloride, styrene, butadiene, vinylidene chloride, and other ethylenically unsaturated monomers. The polymer polyol compositions can contain 1 weight percent (wt %) to 70 wt %, or, more specifically, 5 wt % to 50 wt %, and even more specifically, 10 wt % to 40 wt % monomer polymerized in the polyol, where the weight percent is based on the total weight of polyol. Such compositions are conveniently prepared by polymerizing the monomers in the selected polyol at a temperature of 40° C. to 150° C. in the presence of a free radical polymerization catalyst such as peroxides, persulfates, percarbonate, perborates, azo compounds, and combinations comprising at least one of the foregoing.

The active hydrogen-containing component can also contain polyhydroxyl-containing compounds, such as hydroxyl-terminated polyhydrocarbons (U.S. Pat. No. 2,877,212); hydroxyl-terminated polyformals (U.S. Pat. No. 2,870,097); fatty acid triglycerides (U.S. Pat. Nos. 2,833,730 and 2,878,601); hydroxyl-terminated polyesters (U.S. Pat. Nos. 2,698,838, 2,921,915, 2,591,884, 2,866,762, 2,850,476, 2,602,783, 2,729,618, 2,779,689, 2,811,493, 2,621,166 and 3,169,945); hydroxymethyl-terminated perfluoromethylenes (U.S. Pat. Nos. 2,911,390 and 2,902,473); hydroxyl-terminated polyalkylene ether glycols (U.S. Pat. No. 2,808,391; British Pat. No. 733,624); hydroxyl-terminated polyalkylenearylene ether glycols (U.S. Pat. No. 2,808,391); and hydroxyl-terminated polyalkylene ether triols (U.S. Pat. No. 2,866,774).

In one embodiment, the reactive composition for producing a foam can be substantially in accordance with Japanese Patent Publication No. Sho 53-8735. The polyol desirably used has a repeated unit (referred to as "Unit") of each of PO (propylene oxide) and/or PTMG (tetrahydrofuran subjected to ring-opening polymerization), or the like. In a specific embodiment, the amount of EO (ethylene oxide; $(CH_2CH_2O)_n$) is minimized in order to improve the hygroscopic properties of the foam. Specifically, the percentage of an EO Unit (or an EO Unit ratio) in a polyol can be less than or equal to about 20%. For example, when a polyol to be used merely consists of a PO-Unit and an EO Unit, this polyol is set to be within the range of [the PO Unit]:[the EO Unit]=100:0 to about 80:20. The percentage of an EO Unit is referred to as "EO content".

The polyols can have hydroxyl numbers that vary over a wide range. In general, the hydroxyl numbers of the polyols, including other cross-linking additives, if used, can be about 28 to about 1,000, and higher, or, more specifically, about 100 to about 800. The hydroxyl number is defined as the number of milligrams of potassium hydroxide required for the complete neutralization of the hydrolysis product of the fully acetylated derivative prepared from 1 gram of polyol or mixtures of polyols with or without other cross-linking additives. The hydroxyl number can also be defined by the equation:

$$OH = \frac{56.1 \times 1000 \times f}{M_W}$$

wherein: OH is the hydroxyl number of the polyol,
f is the average functionality, that is the average number of hydroxyl groups per molecule of polyol, and
$M_w$ is the average molecular weight of the polyol.

As noted above, the foams can be chemically blown and/or physically blown (e.g., mechanically frothed). When used, a wide variety of blowing agent(s) can be employed in the reactive compositions, including chemical and/or physical blowing agents. Chemical blowing agents include, for example, water, and chemical compounds that decompose with a high gas yield under specified conditions, for example within a narrow temperature range. Desirably, the decomposition products do not effloresce or have a discoloring effect on the foam product. Exemplary chemical blowing agents include water, azoisobutyronitrile, azodicarbonamide (i.e. azo-bis-formamide) and barium azodicarboxylate; substituted hydrazines (e.g., diphenylsulfone-3,3'-disulfohydrazide, 4,4'-hydroxy-bis-(benzenesulfohydrazide), trihydrazinotriazine, and aryl-bis-(sulfohydrazide)); semicarbazides (e.g., p-tolylene sulfonyl semicarbazide an d4,4'-hydroxy-bis-(benzenesulfonyl semicarbazide)); triazoles (e.g., 5-morpholyl-1,2,3,4-thiatriazole); N-nitroso compounds (e.g., N,N'-dinitrosopentamethylene tetramine and N,N-dimethyl-N,N'-dinitrosophthalmide); benzoxazines (e.g., isatoic anhydride); as well as combinations comprising at least one of the foregoing, such as, sodium carbonate/ citric acid mixtures.

The amount of blowing agents will vary depending on the agent and the desired foam density. In general, these blowing agents are used in an amount of about 0.1 wt % to about 10 wt %, based upon a total weight of the reactive composition. When water is employed as at least one of the blowing agent(s) (e.g., in an amount of about 0.1 wt % to about 8 wt % based upon the total weight of reactive composition), it is generally desirable to control the curing reaction by selectively employing catalysts.

Physical blowing agents can also (or alternatively) be used. These blowing agents can be selected from a broad range of materials, including hydrocarbons, ethers, esters, (including partially halogenated hydrocarbons, ethers, and esters), and so forth, as well as combinations comprising at least one of the foregoing. Exemplary physical blowing agents include the CFC's (chlorofluorocarbons) such as 1,1-dichloro-1-fluoroethane, 1,1-dichloro-2,2,2-trifluoroethane, monochlorodifluoromethane, and 1-chloro-1,1-difluoroethane; the FC's (fluorocarbons) such as 1,1,1,3,3,3-hexafluoropropane, 2,2,4,4-tetrafluorobutane, 1,1,1,3,3,3-hexafluoro-2-methylpropane, 1,1,1,3,3-pentafluoropropane, 1,1,1,2,2-pentafluoropropane, 1,1,1,2,3-pentafluoropropane, 1,1,2,3,3-pentafluoropropane, 1,1,2,2,3-pentafluoropropane, 1,1,1,3,3,4-hexafluorobutane, 1,1,1,3,3-pentafluorobutane, 1,1,1,4,4,4-hexafluorobutane, 1,1,1,4,4-pentafluorobutane, 1,1,2,2,3,3-hexafluoropropane, 1,1,1,2,3,3-hexafluoropropane, 1,1-difluoroethane, 1,1,1,2-tetrafluoroethane, and pentafluoroethane; the FE's (fluoroethers) such as methyl-1,1,1-trifluoroethylether and difluoromethyl-1,1,1-trifluoroethylether; hydrocarbons such as n-pentane, isopentane, and cyclopentane; and well as combinations comprising at least one of the foregoing. As with the chemical blowing agents, the physical blowing agents are used in an amount sufficient to give the resultant foam the desired bulk density. The physical blowing agents can be used in an amount of about 5 wt % to about 50 wt % of the reactive composition, or, more specifically, about 10 wt % to about 30 wt %.

A number of the catalysts capable of catalyzing the reaction of the isocyanate component with the active hydrogen-containing component can be used in the foam preparation. Exemplary catalysts include phosphines; tertiary organic amines; organic and inorganic acid salts of, and organometallic derivatives of: bismuth, lead, tin, iron, antimony, uranium, cadmium, cobalt, thorium, aluminum, mercury, zinc, nickel, cerium, molybdenum, vanadium, copper, manganese, and zirconium; as well as combinations comprising at least one of the foregoing. Specific examples of such catalysts include dibutyltin dilaurate, dibutyltin diacetate, stannous octoate, lead octoate, cobalt naphthenate, triethylamine, triethylenediamine, N,N,N',N'-tetramethylethylenediamine, 1,1,3,3-tetramethylguanidine, N,N,N'N'-tetramethyl-1,3-butanediamine, N,N-dimethylethanolamine, N,N-diethylethanolamine, 1,3,5-tris(N,N-dimethylaminopropyl)-s-hexahydrotriazine, o- and p-(dimethylaminomethyl) phenols, 2,4,6-tris(dimethylaminomethyl) phenol, N,N-dimethylcyclohexylamine, pentamethyldiethylenetriamine, 1,4-diazobicyclo[2.2.2]octane, N-hydroxyl-alkyl quaternary ammonium carboxylates and tetramethylammonium formate, tetramethylammonium acetate, tetramethylammonium 2-ethylhexanoate, and so forth, as well as combinations comprising at least one of the foregoing catalysts. Additional catalysts are set forth in commonly assigned U.S. patent application Ser. No. 11/200,536, filed Aug. 9, 2005.

Metal acetyl acetonates based on metals such as aluminum, barium, cadmium, calcium, cerium (III), chromium (III), cobalt (II), cobalt (III), copper (II), indium, iron (II), lanthanum, lead (II), manganese (II), manganese (III), neodymium, nickel (II), palladium (II), potassium, samarium, sodium, terbium, titanium, vanadium, yttrium, zinc and zirconium. A common catalyst is bis(2,4-pentanedionate) nickel (II) (also known as nickel acetylacetonate or diacetylacetonate nickel) and derivatives thereof such as diacetonitrilediacetylacetonato nickel, diphenylnitrilediacetylacetonato nickel, bis(triphenylphosphine)diacetyl acetylacetonato nickel, and so forth, can be employed. Ferric acetylacetonate (FeAA) is particularly preferred, due to its relative stability, good catalytic activity, and lack of toxicity.

Added to the metal acetyl acetonate can be acetyl acetone (2,4-pentanedione), as disclosed in commonly assigned U.S. Pat. No. 5,733,945 to Simpson. Not to be limited by theory, the acetyl acetone provides heat latency, which allows time for the required mixing, casting and other procedures, and avoids deleterious premature curing during low temperature processing. However, as the material is cured in several heating zones and the temperature of the urethane mixture rises, the acetyl acetone is driven off. With the acetyl acetone removed together with its associated delaying function, the metal acetyl acetonate is allowed to resume its normally high reactivity and provide a very high level of catalysis at the end of the polyurethane reaction. This high reactivity late in the processing cycle is advantageous and provides improved physical properties such as compression set. In general, the ratio of metal acetyl acetonate to acetyl acetone is about 2:1 on a weight basis.

The amount of catalyst present in the reactive composition can be about 0.03 wt % to about 3.0 wt %, based on the weight of the active hydrogen-containing component.

In one embodiment, when water is used as the blowing agent, ferric acetylacetonate (FeAA) is selected as the catalyst. Other catalysts or adjuvants, e.g., amines, can be used to adjust the relative reaction rates of water and urethane. The water reacts with the isocyanate releasing $CO_2$. The FeAA with acetyl acetone simultaneously catalyzes the curing reaction in a delayed fashion, which prevents premature curing and therefore allows the chemical (and optionally physical) blowing to continue unhindered. The catalyst eventually permits a full cure of the polyurethane foam. The metal acetylacetonate is most conveniently added by predissolution in a solvent. Exemplary solvent such as dipropylene glycol or other hydroxyl containing components which will then participate in the reaction and become part of the final product.

A wide variety of surfactants can be used for purposes of stabilizing the polyurethane foam before it is cured, including mixtures of surfactants. Organosilicone surfactants are especially useful, such as a copolymer consisting essentially of $SiO_2$ (silicate) units and $(CH_3)_3SiO_{0.5}$ (trimethylsiloxy) units in a molar ratio of silicate to trimethylsiloxy units of about 0.8:1 to about 2.2:1, or, more specifically, about 1:1 to about 2.0:1. Another organosilicone surfactant stabilizer is a partially cross-linked siloxane-polyoxyalkylene block copolymer and mixtures thereof wherein the siloxane blocks and polyoxyalkylene blocks are linked by silicon to carbon, or by silicon to oxygen to carbon, linkages. The siloxane blocks comprise hydrocarbon-siloxane groups and have an average of at least two valences of silicon per block combined in the linkages. At least a portion of the polyoxyalkylene blocks comprise oxyalkylene groups and are polyvalent, i.e., have at least two valences of carbon and/or carbon-bonded oxygen per block combined in said linkages. Any remaining polyoxyalkylene blocks comprise oxyalkylene groups and are monovalent, i.e., have only one valence of carbon or carbon-bonded oxygen per block combined in said linkages. Additional organopolysiloxane-polyoxyalkylene block copolymers include those described in U.S. Pat. Nos. 2,834,748, 2,846,458, 2,868,824, 2,917,480 and 3,057,901. Combinations comprising at least one of the foregoing surfactants can also be employed. The amount of the organosilicone polymer used as a foam stabilizer can vary over wide limits, e.g., about 0.5 wt % to about 10 wt % or more, based on the amount of the active hydrogen component, or, more specifically, about 1.0 wt % to about 6.0 wt %.

In one embodiment, the foams can be produced by mechanically mixing the reactive composition (i.e., isocyanate component(s), active hydrogen-containing component(s), froth-stabilizing surfactant(s), catalyst(s), and any optional additive(s)) with a froth-forming gas in a predetermined amount. In one manner of proceeding, the components of the reactive composition are first mixed together and then subjected to mechanical frothing with air. Alternatively, the components can be added sequentially to the liquid phase during the mechanical frothing process. The gas phase of the froths can be air because of its cheapness and ready availability. However, if desired, other gases can be used that are gaseous at ambient conditions and that are substantially inert or non-reactive with all components of the liquid phase. Other gases include, for example, nitrogen, carbon dioxide, and fluorocarbons that are normally gaseous at ambient temperatures.

The inert gas is incorporated into the liquid phase by mechanical beating of the liquid phase in high shear equipment such as in a Hobart mixer or an Oakes mixer. The gas can be introduced under pressure or it can be drawn in from the overlying atmosphere by the beating or whipping action as in a Hobart mixer. The mechanical beating operation can be conducted at standard pressures, for example pressures of about 100 pounds per square inch (psi) to about 200 psi (689 kilopascals (kPa) to 1,379 kPa). Readily available mixing equipment can be used. The amount of inert gas beaten into the liquid phase is controlled by gas flow metering equipment to produce a froth of the desired density. The mechanical beating is conducted over an appropriate period to obtain the desired froth density, for example a few seconds in an Oakes mixer, or 3 to 30 minutes in a Hobart mixer. The froth as it emerges from the mechanical beating operation is substantially chemically stable and is structurally stable, but easily workable at ambient temperatures, e.g., about 10° C. to about 40° C.

After frothing, the reactive mixture is deposited onto the first carrier. For convenience, this first carrier can be referred to as "bottom carrier," and is generally a moving support that may or may not readily release the cured foam. A second carrier, also referred to herein as a "surface protective layer" or "top carrier" can optionally be placed on top of the froth. The optional top carrier is also a moving support that also may or may not readily release from the cured foam, provided that at least one carrier readily releases from the foam. The top carrier can be applied almost simultaneously with the froth. Before applying the top carrier, the foam can be spread to a layer of desired thickness, e.g., by a doctoring blade or other spreading device. Alternatively, placement of the top carrier can be used to spread the foam and adjust the frothed layer to the desired thickness. In still another embodiment, a coater can be used after placement of the top carrier to adjust the height of the foam. Once at the desired height, the frothed foam can also be blown under the influence of a physical or chemical blowing agent.

In practice, the carriers can be played out from supply rolls and ultimately rewound on take-up rolls upon separation from the cured polyurethane foam. The selection of materials for the top and bottom carriers will depend on factors such as the desired degree of support and flexibility, the desired degree of releasability from the cured foam, cost, aesthetics, and so forth, considerations. Paper, thin sheets of metal such as stainless steel, or polymer films such as polyethylene terephthalate, silicone, or the like, can be used. The material can be coated with a release coating. In one embodiment, the carrier can be coated with a material intended to be transferred to the surface of the cured polyurethane foam, for example a substrate film that is releasable from the carrier. A fibrous web or other filler material can be disposed on the surface of the carrier, and thereby become ultimately incorporated into the cured foam. In another embodiment, the foam can cure to one or both of the carriers. Thus, one carrier can form part of the final product instead of being separated from the foam. Alternatively, or in addition, a conveyor belt can be used as the bottom carrier. The carriers can have a plain surface or a textured surface. In a particular embodiment, the surface of the foam is provided with a skin layer.

The polyurethane can be blended or combined with various other thermoplastic or thermoset resins. Blends of thermosetting resins as well as blends of thermoplastic resins with thermosetting resins can be used. Some possible resins include silicone, polyolefin (e.g., polyethylene, polypropylene, ethylene-propylene copolymers, and so forth), polyesters, fluorinated polymers, polyalkylene oxides (e.g., polyethylene oxide and polypropylene oxide), polyvinyl alcohol, ionomers (e.g., ethylene-methacrylic acid copolymers neutralized with base), cellulose acetate, polystyrene, and so forth, as well as combinations comprising at least one of the foregoing. Further examples of thermoplastic resins that can be used include polyacetals, polyacrylics, acrylonitrile, acrylonitrile-butadiene-styrene, polycarbonates, polyethylene terephthalates, polybutylene terephthalates, polyamides such as, but not limited to Nylon 6, Nylon 6,6, Nylon 6,10, Nylon 6,12, Nylon 11 or Nylon 12, polyamideimides, polyarylates, ethylene propylene rubbers (EPR), polyarylsulfones, polyethersulfones, polyphenylene sulfides, polyvinyl chlorides, polysulfones, polyetherimides, polytetrafluoroethylenes, fluorinated ethylene propylenes, polychlorotrifluoroethylenes, polyvinylidene fluorides, polyvinyl fluorides, polyetherketones, polyether etherketones, polyether ketone, ketones, and the like, or a combination comprising at least one of the foregoing thermoplastic resins.

Silicone foams comprising a polysiloxane polymer can also be used. In one embodiment, the silicone foams are produced as a result of the reaction between water and hydride groups in a polysiloxane polymer precursor composition with the consequent liberation of hydrogen gas. This reaction is generally catalyzed by a noble metal, specifically a platinum catalyst. In one embodiment, the polysiloxane polymer has a viscosity of about 100 to 1,000, 000 poise at 25° C. and has chain substituents selected from the group consisting of hydride, methyl, ethyl, propyl, vinyl, phenyl, and trifluoropropyl. The end groups on the polysiloxane polymer can be hydride, hydroxyl, vinyl, vinyl diorganosiloxy, alkoxy, acyloxy, allyl, oxime, aminoxy, isopropenoxy, epoxy, mercapto groups, or other known, reactive end groups. Suitable silicone foams can also be produced by using several polysiloxane polymers, each having different molecular weights (e.g., bimodal or trimodal molecular weight distributions) as long as the viscosity of the combination lies within the above specified values. It is also possible to have several polysiloxane base polymers with different functional or reactive groups in order to produce the desired foam. In one embodiment, the polysiloxane polymer comprises about 0.2 moles of hydride (Si—H) groups per mole of water.

Depending upon the chemistry of the polysiloxane polymers used, a catalyst, generally platinum or a platinum-containing catalyst, can be used to catalyze the blowing and the curing reaction. The catalyst can be deposited onto an inert carrier, such as silica gel, alumina, or carbon black. In one embodiment, an unsupported catalyst selected from among chloroplatinic acid, its hexahydrate form, its alkali metal salts, and its complexes with organic derivatives is used. Exemplary catalysts are the reaction products of chloroplatinic acid with vinylpolysiloxanes such as 1,3-divinyltetramethyldisiloxane, which are treated or otherwise with an alkaline agent to partly or completely remove the chlorine atoms; the reaction products of chloroplatinic acid with alcohols, ethers, and aldehydes; and platinum chelates and platinous chloride complexes with phosphines, phosphine oxides, and with olefins such as ethylene, propylene, and styrene. It can also be desirable, depending upon the chemistry of the polysiloxane polymers to use other catalysts such as dibutyl tin dilaurate in lieu of platinum based catalysts.

Various platinum catalyst inhibitors can also be used to control the kinetics of the blowing and curing reactions in order to control the porosity and density of the silicone foams. Examples of such inhibitors include polymethylvinylsiloxane cyclic compounds and acetylenic alcohols. These inhibitors should not interfere with the foaming and curing in such a manner that destroys the foam.

Physical or chemical blowing agents can be used to produce the silicone foam, including the physical and chemical blowing agents listed above for polyurethanes. Other examples of chemical blowing agents include benzyl alcohol, methanol, ethanol, isopropyl alcohol, butanediol, and silanols. In one embodiment, a combination of methods of blowing is used to obtain foams having desirable characteristics. For example, a physical blowing agent such as a chlorofluorocarbon can be added as a secondary blowing agent to a reactive mixture wherein the primary mode of blowing is the hydrogen released as the result of the reaction between water and hydride substituents on the polysiloxane.

In the production of silicone foams, the reactive components of the precursor composition are stored in two packages, one containing the platinum catalyst and the other the polysiloxane polymer containing hydride groups, which prevents premature reaction. In another method of production, the polysiloxane polymer is introduced into an extruder along with the electrically conductive particles, water, physical blowing agents if necessary, and other desirable additives. The platinum catalyst is then metered into the extruder to start the foaming and curing reaction. The use of physical blowing agents such as liquid carbon dioxide or supercritical carbon dioxide in conjunction with chemical blowing agents such as water can give rise to foam having much lower densities. In yet another method, the liquid silicone components are metered, mixed and dispensed into a device such a mold or a continuous coating line. The foaming then occurs either in the mold or on the continuous coating line.

In addition to the above-mentioned optional thermally conductive fillers in the formulation of the foam pad, depending upon the requirements of the particular application envisioned, other optional filler additives can be added to the reactive composition, e.g., the polyurethane froth mixture in the manufacture thereof. For example, non-thermally conductive fillers (alumina trihydrate, silica, talc, calcium carbonate, clay, and so forth), pigments (for example titanium dioxide and iron oxide), and so forth, as well as combinations comprising at least one of the foregoing additives, can also be used. Reinforcing fillers such as woven webs, silica, glass particles, and glass microballoons can be used.

In addition to optional fillers, other additives known for use in the manufacture of foams can be present in the foam composition for the foam pad. Suitable flame retardants include, for example, a metal hydroxide containing aluminum, magnesium, zinc, boron, calcium, nickel, cobalt, tin, molybdenum, copper, iron, titanium, or a combination thereof, for example aluminum trihydroxide, magnesium hydroxide, calcium hydroxide, iron hydroxide, and the like; a metal oxide such as antimony oxide, antimony trioxide, antimony pentoxide, iron oxide, titanium oxide, manganese oxide, magnesium oxide, zirconium oxide, zinc oxide, molybdenum oxide, cobalt oxide, bismuth oxide, chromium oxide, tin oxide, nickel oxide, copper oxide, tungsten oxide, and the like; metal borates such as zinc borate, zinc metaborate, barium metaborate, and the like; metal carbonates such as zinc carbonate, magnesium carbonate, calcium carbonate, barium carbonate, and the like; melamine cyanurate, melamine phosphate, and the like; carbon black, expandable graphite flakes (for example those available from GrafTech International, Ltd. under the tradename GRAFGUARD), and the like; nanoclays; and brominated compounds. Exemplary flame retardant materials are magnesium hydroxides, nanoclays, and brominated compounds. In one embodiment, flame retardance of the polymer foam meets certain Underwriter's Laboratories (UL) standards for flame retardance. For example, the polymer foam has a rating of V-0 under UL Standard 94.

Still other additives that can be present include dyes, antioxidants, ultraviolet (UV) stabilizers, catalysts for cure of the polymer, crosslinking agents, and the like, as well as combinations comprising at least one of the foregoing additives.

The properties of the foams formed as described above (e.g., density, modulus, compression load deflection, tensile strength, tear strength, and so forth) can be adjusted by varying the components of the reactive compositions. In general, the foam can have a density of about 50 kg/m$^3$ to about 500 kg/m$^3$, specifically at least about 70 kg/m$^3$, more specifically about 90 kg/m$^3$ to about 400 kg/m$^3$. Such foams can also have a thickness of about 0.1 millimeters (mm) to about 25 mm, specifically about 0.25 mm to about 15 mm, more specifically about 0.3 mm to about 10 mm.

The physical properties of such foams are excellent. For example, such foams can have a compression set resistance of less than or equal to about 10%, or, more specifically, less than or equal to about 5%.

In order to provide good mechanical properties to the foam, the average cellular diameter of the foam can be about 10 micrometers (μm) to about 1 millimeter (mm), or, more specifically, about 50 micrometers to about 500 micrometers. In open-celled foams where at least a portion of the cells extend through the sheet, through holes can be distinguished from such open cells on the basis of size. For example, in a mechanically frothed foam, the smallest diameter of a through hole is at least ten times larger than the largest diameter of a cell. In a blown foam, or non-microcellular foam, the smallest diameter of a through hole is at least twice as large as the largest diameter of the cell.

The non-foam thermally conductive composition for filling the through holes can be formed by the reaction of a precursor composition comprising a liquid silicone polymer, specifically comprising a polysiloxane having at least two alkenyl groups per molecule and a polysiloxane having at least two silicon-bonded hydrogen atoms, in a quantity effective to cure the composition, further in the presence of a catalyst. Suitable reactive silicone compositions are low durometer, two-package (for example, 1:1) liquid silicone rubber (LSR) or liquid injection molded (LIM) compositions. Because of their low inherent viscosity, the use of a low durometer LSR or LIM composition can facilitate the addition of higher filler quantities.

In one embodiment, an LSR or LIM system can be provided as two-part formulations suitable for mixing in ratios of about 1:1 by volume. The "A" part of the formulation can comprise one or more polysiloxanes having two or more alkenyl groups. Suitable alkenyl groups are exemplified by vinyl, allyl, butenyl, pentenyl, hexenyl, and heptenyl, specifically vinyl. The alkenyl group can be bonded at the molecular chain terminals, in pendant positions on the molecular chain, or both. Other silicon-bonded organic groups in the polysiloxane having two or more alkenyl groups can be exemplified by substituted and unsubstituted monovalent hydrocarbon groups, for example, alkyl groups such as methyl, ethyl, propyl, butyl, pentyl, and hexyl; aryl groups such as phenyl, tolyl, and xylyl; aralkyl groups such as benzyl and phenethyl; and halogenated alkyl groups such as 3-chloropropyl and 3,3,3-trifluoropropyl. Exemplary substituents are methyl and phenyl groups.

The alkenyl-containing polysiloxane can have straight chain, partially branched straight chain, branched-chain, or network molecule structure, or can be a mixture of two or more selections from polysiloxanes with the exemplified molecular structures. The alkenyl-containing polysiloxane is exemplified by trimethylsiloxy-endblocked dimethylsiloxane-methylvinylsiloxane copolymers, trimethylsiloxy-endblocked methylvinylsiloxane-methylphenylsiloxane copolymers, trimethylsiloxy-end blocked dimethylsiloxane-methylvinylsiloxane-methylphenylsiloxane copolymers, dimethylvinylsiloxy-endblocked dimethylpolysiloxanes, dimethylvinylsiloxy-endblocked methylvinylpolysiloxanes, dimethylvinylsiloxy-endblocked methylvinylphenylsiloxanes, dimethylvinylsiloxy-endblocked dimethylvinylsiloxane-methylvinylsiloxane copolymers, dimethylvinylsiloxy-endblocked dimethylsiloxane-methylphenylsiloxane copolymers, dimethylvinylsiloxy-endblocked dimethylsiloxane-diphenylsiloxane copolymers, polysiloxane comprising $R_3SiO_{1/2}$ and $SiO_{4/2}$ units, polysiloxane comprising $RSiO_{3/2}$ units, polysiloxane comprising the $R_2SiO_{2/2}$ and $RSiO_{3/2}$ units, polysiloxane comprising the $R_2SiO_{2/2}$, $RSiO_{3/2}$ and $SiO_{4/2}$ units, and a mixture of two or more of the preceding polysiloxanes. R represents substituted and unsubstituted monovalent hydrocarbon groups, for example, alkyl groups such as methyl, ethyl, propyl, butyl, pentyl, and hexyl; aryl groups such as phenyl, tolyl, and xylyl; aralkyl groups such as benzyl and phenethyl; and halogenated alkyl groups such as 3-chloropropyl and 3,3,3-trifluoropropyl, with the proviso that at least 2 of the R groups per molecule are alkenyl.

A "B" component of an LSR or LIM system can comprise one or more polysiloxanes that contain at least two silicon-bonded hydrogen atoms per molecule and has an extrusion rate of less than about 500 g/minute. The hydrogen can be bonded at the molecular chain terminals, in pendant positions on the molecular chain, or both. Other silicon-bonded groups are organic groups exemplified by non-alkenyl, substituted and unsubstituted monovalent hydrocarbon groups, for example, alkyl groups such as methyl, ethyl, propyl, butyl, pentyl, and hexyl; aryl groups such as phenyl, tolyl, and xylyl; aralkyl groups such as benzyl and phenethyl; and halogenated alkyl groups such as 3-chloropropyl and 3,3,3-trifluoropropyl. Exemplary substituents are methyl and phenyl groups.

The hydrogen-containing polysiloxane component can have straight-chain, partially branched straight-chain, branched-chain, cyclic, network molecular structure, or can be a mixture of two or more selections from polysiloxanes with the exemplified molecular structures. The hydrogen-containing polysiloxane is exemplified by trimethylsiloxy-endblocked methylhydrogenpolysiloxanes, trimethylsiloxy-endblocked dimethylsiloxane-methylhydrogensiloxane copolymers, trimethylsiloxy-endblocked methylhydrogensiloxane-methylphenylsiloxane copolymers, trimethylsiloxy-endblocked dimethylsiloxane-methylhydrogensiloxane-methylphenylsiloxane copolymers, dimethylhydrogensiloxy-endblocked dimethylpolysiloxanes, dimethylhydrogensiloxy-endblocked methylhydrogenpolysiloxanes, dimethylhydrogensiloxy-endblocked dimethylsiloxanes-methylhydrogensiloxane copolymers, dimethylhydrogensiloxy-endblocked dimethylsiloxane-methylphenylsiloxane copolymers, and dimethylhydrogensiloxy-endblocked methylphenylpolysiloxanes.

The hydrogen-containing polysiloxane component is added in an amount sufficient to cure the composition, specifically in a quantity of about 0.5 to about 10 silicon-bonded hydrogen atoms per alkenyl group in the alkenyl-containing polysiloxane.

The silicone composition further comprises, generally as part of Component "A," a catalyst such as platinum to accelerate the cure. Platinum and platinum compounds known as hydrosilylation-reaction catalysts can be used, for example platinum black, platinum-on-alumina powder, platinum-on-silica powder, platinum-on-carbon powder, chloroplatinic acid, alcohol solutions of chloroplatinic acid platinum-olefin complexes, platinum-alkenylsiloxane complexes and the catalysts afforded by the microparticulation of the dispersion of a platinum addition-reaction catalyst, as described above, in a thermoplastic resin such as methyl methacrylate, polycarbonate, polystyrene, silicone, and the like. Mixtures of catalysts can also be used. A quantity of catalyst effective to cure the present composition is generally from 0.1 to 1,000 parts per million (by weight) of platinum metal based on the combined amounts of alkenyl and hydrogen components.

Reactive polysiloxane fluids co-cure with the alkenyl-containing polysiloxane and the polysiloxane having at least two silicon-bonded hydrogen atoms, and therefore can themselves contain alkenyl groups or silicon-bonded hydrogen groups. Such compounds can have the same structures as described above in connection with the alkenyl-containing polysiloxane and the polysiloxane having at least two silicon-bonded hydrogen atoms, but in addition have a viscosity of less than or equal to about 1000 centipoise (cps), specifically less than or equal to about 750 cps, more specifically less than or equal to about 600 cps, and most specifically less than or equal to about 500 cps. In one embodiment, the reactive polysiloxane fluids have a boiling point greater than the curing temperature of the addition cure reaction.

The silicone foams can further optionally comprise a curable silicone gel formulation. Silicone gels are lightly cross-linked fluids or under-cured elastomers. They are unique in that they range from very soft and tacky to moderately soft and only slightly sticky to the touch. Use of a gel formulation decreases the viscosity of the composition, thereby allowing at least one of an increased filler loading, enhanced filler wetting, and/or enhanced filler distribution, thereby resulting in cured compositions having lower resistance and resistivity values and increased softness. Suitable gel formulations can be either two-part curable formulations or one-part formulations. The components of the two-part curable gel formulations is similar to that described above for LSR systems (i.e., an organopolysiloxane having at least two alkenyl groups per molecule and an organopolysiloxane having at least two silicon-bonded hydrogen atoms per molecule). The main difference lies in the fact that no filler is present, and that the molar ratio of the silicon-bonded hydrogen groups (Si—H) groups to the alkenyl groups is usually less than one, and can be varied to create a "under-cross linked" polymer with the looseness and softness of a cured gel. Specifically, the ratio of silicone-bonded hydrogen atoms to alkenyl groups is less than or equal to about 1.0, specifically less than or equal to about 0.75, more specifically less than or equal to about 0.6, and most specifically less than or equal to about 0.1. An example of a suitable two-part silicone gel formulation is SYLGARD® 527 gel commercially available from the Dow Corning Corporation.

Optionally a low viscosity reactive or non-reactive polysiloxane fluid having a viscosity of about 100 to about 1000 centipoise can also be present. The presence of a such a low viscosity polysiloxane fluid can allow higher quantities of filler incorporated into the thermally conductive precursor composition, for example, to produce a cured silicone composition, thereby lower the obtained volume resistivity and surface resistivity values. In one embodiment, the polysiloxane fluid remains within the cured silicone and is not extracted or removed. The non-reactive silicone fluid can thus become part of the polymer matrix, leading to low outgassing and little or no migration to the surface during use. In one embodiment, the boiling point of the non-reactive polysiloxane fluid can be high enough such that when it is dispersed in the polymer matrix, it does not evaporate during or after cure, and does not migrate to the surface or outgas. Use of the low viscosity polysiloxane fluid can obviate the need for an organic solvent and a subsequent removal step. The polysiloxane fluid component can be present in an amount effective to allow the addition, incorporation, and wetting of higher quantities of thermally conductive filer.

In one embodiment, a non-foam thermally conductive composition for example, a reactive silicone system, can be used to fill the through holes in a foam pad as follows. After the foam material (for example a polyurethane foam as described above) is heated and at least partially cured or partially melted, it can be passed to a cooling zone where it is cooled by any suitable cooling device such as fans. Where appropriate, a carrier for the foam material is removed and the foam material can be taken up on a roll for later use. In such a production mode, the length of the foamed sheet can be up to 5 meters or more. One embodiment of an apparatus for the manufacture of a polyurethane foam material is described in U.S. patent application Ser. No. 11/200,536.

The through holes can be formed into the foam material at various points during the polyurethane material forming process (e.g., if the material comprises a thermoplastic, before, during, and/or after partial curing of the sheet; and if the material comprises a thermoset, before, during and/or after partial setting (e.g., solidification) of the sheet). In some embodiments, the holes are formed after the sheet is cast, but before substantial cure of the foam. In another embodiment, the foam is at least partially cured prior to through-hole formation to inhibit the foam from flowing into and closing the holes. In another embodiment, the holes are formed during the curing process. For example, the hole can be formed when the extent of reaction of the material (e.g., the degree of cure; or, in the case of thermoplastic material(s), the degree of solidification), is less than or equal to about 90%, or, more specifically, is less than or equal to about 80%, or, yet more specifically, is less than or equal to about 60%.

The non-foam thermally conductive composition, comprising the thermally conductive particulate filler, for filling the through holes in the foam pad material can be applied to the surface of the polyurethane pad material in a conventional counter top lab coater, with a plastic carrier under the perforated foam substrate. The thermally conductive composition, for example a reactive silicone system in which the filler is dispersed, can be poured over the perforated foam pad and hand casted over a set gap. The product can then be cured in an oven at an elevated temperature for an appropriate time, for example 1 minute to 60 minutes. By adjusting the gap, the thickness of optionally coating (of the thermally conductive composition) in the x-y direction can be adjusted. The thickness of such a coating, for example comprising a silicone system, can vary between 0 and 50%, specifically between 1 and 30 of the thickness of overall thickness of the sheet, more specifically 5 to 25%.

In one embodiment, a pressure-sensitive (PSA) or other adhesive can be used to secure the compressible thermally conductive sheet in place between two components in a wide variety of applications, including various electronic equipment. [Please edit list of equipment as appropriate] Applications within the scope of the present invention can include, by way of example, telecom base stations, consumer electronics such as cell phones, computer monitors, plasma TVs, automotive electronic components and systems, circuit boards, card cages, vents, covers, PCMCIA cards, back or face planes, shielding caps or cans, or I/O connector panels of an electronic device, or of an enclosure or cabinet therefore. It will be appreciated that aspects of the present invention can find advantageous use in various other applications requiring a resilient, thermally conductive sheet material.

The compressible thermally-conductive sheet of claim can have one or more of the following properties: a thermal conductivity of at least about 0.5 W/m-K, specifically at least about 1 W/m-K, compression set of less than or equal to 10% after 50% compression for 22 hours at room temperature; and a compression force deflection at 25% of 1 to 20 psi, specifically 2 to 15 psi.

EXAMPLES

A compressible thermally conductive sheet was prepared as follows. A polyurethane foam material (Poron® 92-15020), manufactured and sold by the Rogers (Connecticut), a division of World Properties Corporation, was evaluated for thermal conductivity at various thicknesses. The sample had a density of 15 pcf (240 kg/m$^3$) and a thickness of 0.020 inches (0.50 mm). Subsequently, a 0.5-mm hole punch was used to punch holes for making inventive samples. Two different hole patterns were used. According to the first pattern, holes were provided every 0.5 mm in the X direction and every 0.5 mm in the Y direction. The perforated foam substrate had a perforation density of 1 million holes per square meter. The second pattern had holes of the same size separated in the X direction and Y direction to obtain a perforation density of 0.5 million holes per square meter.

Thermally conductive polymer blends were used to fill the through holes and provide coatings on the surfaces of the foam material to make compressible thermally conductive sheets. The sheets were then tested for thermal conductivity, in accordance with ASTM D5470, and for compression set and compression force deflection (CFD), as detailed below.

The thermally conductive polymer blends comprised at least one silicone (specifically, a gel or LSR) and boron nitride filler particles. Several types of boron nitride filler were experimentally tested and the loading necessary for a given thermal conductivity was determined. A mix of silicone polymer and fillers needed to retain the ability to flow through the perforated through holes in the foam material was employed. A list of boron nitride fillers used in the formulations is provided in the following Table 1:

TABLE 1

| Filler | Manufacturer | Particle Size/Shape | Thermal Conductivity (w/mK) | Surface Area (m$^2$/g) |
|---|---|---|---|---|
| PolarTherm® PT350 BN | Momentive | 125-150 μm/ Hexagonal Agglomerates | 150-300 | 3.3 |
| PolarTherm® PTX60 BN | Momentive | 60 μm/ Spherical Agglomerates | 150-300 | 5.5 |
| Carbotherm® PCTH7MHF BN | Saint Gobain | 100 μm/HD Agglomerate | 50-150 | 2.5 |

Due to the high surface area, these fillers can increase viscosity quickly. Viscosity of loaded mixes can peak over 200,000 cps. An organic solvent such as toluene can be added to decrease the viscosity; a workable viscosity range is around 80,000 cps. Viscosity is measured with a Brooks meter with #6 spindle and 2 rpm, 10 rpm and 25 rpm settings. Formulations were optimized for workable viscosity, polymer blend toughness, and maximum thermal conductivity. The bulkier the filler, the less viscous the precursor composition.

The silicones used in the experimental formulations included Dow Corning Sylgard® 527, a two-part heat-cured soft gel with low viscosity; Momentive LIM 6010®, a two-part heat-cured LSR to provide toughness; and Nusil 213®, a two-part heat-cured firm gel with low viscosity.

Two formulation examples are shown in the Tables 2-3 below. Formulation 1 used toluene to reduce formulation viscosity, and toluene was driven off during the curing process. Formulation 2 contained no additional solvent.

TABLE 2

(Formulation 1)

| Part A | Amount (g) | Part B | Amount (g) |
|---|---|---|---|
| LIM 6010A® silicone | 5 | LIM 6010B® silicone | 5 |
| Sylgard 527A® silicone | 10 | Sylgard 527B® silicone | 10 |
| PTX60® filler | 15 | PTX60® filler | 15 |
| Toluene | 5 | Toluene | 5 |

TABLE 3

(Formulation 2)

| Part A | Amount (g) | Part B | Amount (g) |
|---|---|---|---|
| Sylgard 527A® silicone | 15 | Sylgard 523B® silicone | 15 |
| Nusil 213A® silicone | 10 | Nusil 213B® silicone | 10 |
| PCTH7MHF® filler | 30 | PCTH7MHF® filler | 30 |

Sample Preparation: Part A and Part B of each formulation were first mixed separately using a high speed mixer (Flacktec®) until both were homogeneous. Parts A and B were then mixed together using the mixer.

Using an LC-100® counter top lab coater, with a polycarbonate carrier under the perforated foam substrate, the mixed silicone-containing thermally conductive composition was poured over the perforated foam and hand casted over a set gap. The sample was then cured in an XP oven at 110° C. for 10 minutes. By adjusting the gap, the thickness of high T$_c$ silicone coating was adjusted. In all cases, the thermally conductive composition was able to flow through the perforated through holes and form continuous pathway for heat to conduct.

Testing: Two testing devices were used to measure the thermal conductivity of samples, an Anter Unitherm® 2022 (ASTM E1530) test apparatus and a T.I.M. test apparatus by Analysis Tech (ASTM D5470). Both devices present thermal conductivity in W/mK. Thermal conductivities of compressible materials vary with the pressure and gap during testing. Both methods use three measurements, applying fixed pressure or a fixed gap to the material. Thermal conductivities and physical properties of tested samples are listed in the Table 4 below. Values in thermal conductivity here are based off the 20 psi measurement. Compared to Poron® 92-15020 foam with PET support, the sheet material with filled perforated holes, using thermally conductive silicone compositions, Modulus as reflected by compression force deflection (CFD) can be determined on an Instron®. CFD is measured by calculating the force in pounds per square inch (psi) required to compress the sample to 25% of the original thickness in accordance with ASTM D1056.

Compression set is determined by measuring amount in percent by which a standard test piece of the foam fails to return to its original thickness after being subjected to a 50% compression for 22 hours at the specified room temperature.

Figure 2:
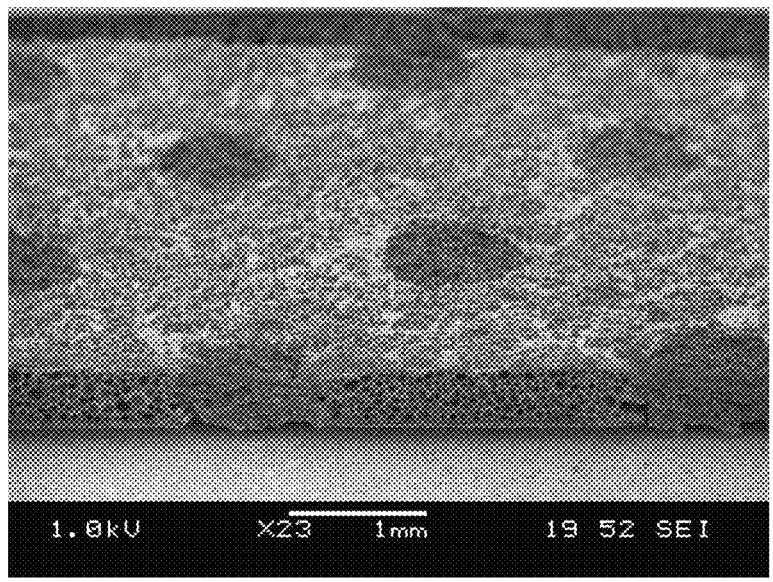
FIG. 2 shows an SEM image of the embodiment of Example 3 herein, wherein the foam sheet has been perforated with 500,000 holes/m² and in which a thin filled coating is provided over the surfaces of the polyurethane sheet.
Figure 3:
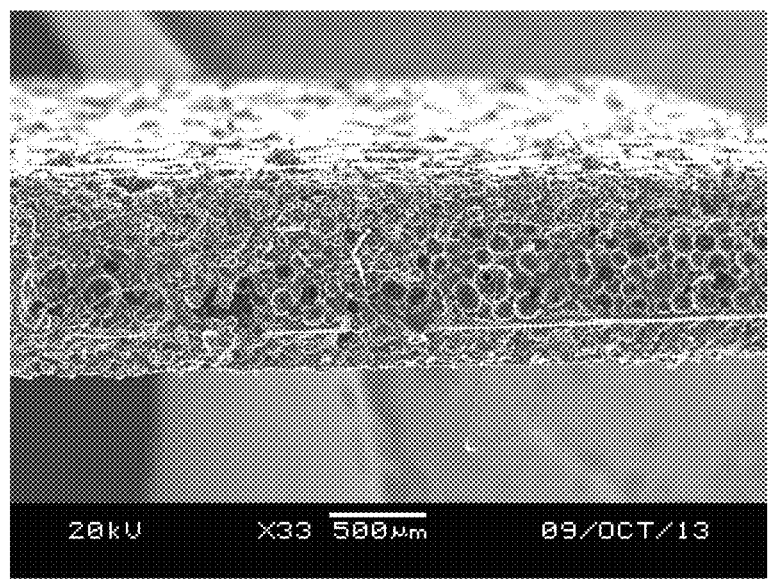
FIG. 3 shows an SEM image of yet another embodiment of the present invention, wherein the foam sheet has been perforated with 500,000 holes/m² holes/m² and in which a relatively thick filled coating creates continuous silicone layers on both surfaces of the foam sheet material.

FIGS. 1-3 show SEM images demonstrating the different perforation patterns and coating thickness for Examples 1, 3, and 2, respectively.

The test results are shown in Table 4.

TABLE 4

| Example | Formulation | Foam | Perforation | Thickness (inch) | Density (pcf) | Compression Force Deflection at 25% (psi) | Compression Set (%) | Thermal Conductivity at 70° C. (W/mK) |
|---|---|---|---|---|---|---|---|---|
| Control | N/A | Poron ® 92-15020 Polyurethane | N/A | 0.021 | 15 | 2.42 | 1 | 0.06-0.137 |
| 1 | Formulation 2 | Poron ® 92-15020 Polyurethane | 1 MM holes/m² | 0.025 | 59 | 6.32 | 3.25 | 0.67-0.95 |
| 2 | Formulation 2 | Poron ® 92-15020 Polyurethane | 1 MM holes/m² | 0.041 | 63 | 11.9 | 4.9 | 1.14-1.35 |
| 3 | Formulation 1 | Poron ® 92-15020 Polyurethane | 500K holes/m² | 0.028 | 61 | 4.38 | 3 | 0.94 |
| 4 | Formulation 2 | N/A | N/A | 0.118 | 80 | — | — | 3.79 |

Based on the results in Table 4, compressible thermally conductive sheets according to the present invention were shown to increase thermal conductivity by an order of magnitude while maintaining low compression set. All of the samples measured had good compression set resistance (less than 10%, specifically less than 5%) measured at room temperature, after compression for 22 hours. Depending on the application, the pads with the thicker surface coating can be used to increase surface conductivity in the x-y direction in addition to the z-direction, although the compression set and compression force deflection may also increase to a small extent.

Ranges disclosed herein are inclusive of the recited endpoint and combinable (e.g., ranges of "up to about 25 wt %, or, more specifically, about 5 wt % to about 20 wt %", is inclusive of the endpoints and all intermediate values of the ranges of "about 5 wt % to about 25 wt %," etc.). "Combination" is inclusive of blends, mixtures, alloys, reaction products, and the like. Also, "combinations comprising at least one of the foregoing" clarifies that the list is inclusive of each element individually, as well as combinations of two or more elements of the list, and combinations of one or more elements of the list with non-list elements. Furthermore, the terms "first," "second," and so forth, herein do not denote any order, quantity, or importance, but rather are used to distinguish one element from another, and the terms "a" and "an" herein do not denote a limitation of quantity, but rather denote the presence of at least one of the referenced item. The modifier "about" used in connection with a quantity is inclusive of the state value and has the meaning dictated by context, (e.g., includes the degree of error associated with measurement of the particular quantity). The suffix "(s)" as used herein is intended to include both the singular and the plural of the term that it modifies, thereby including one or more of that term (e.g., the foam(s) includes one or more foams). Reference throughout the specification to "one embodiment", "another embodiment", "an embodiment", and so forth, means that a particular element (e.g., feature, structure, and/or characteristic) described in connection with the embodiment is included in at least one embodiment described herein, and is optionally present in other embodiments. In addition, it is to be understood that the described elements can be combined in any suitable manner in the various embodiments. As used herein, the terms sheet, film, plate, and layer, are used interchangeably, and are not intended to denote size.

All cited patents, patent applications, and other references are incorporated herein by reference in their entirety. However, if a term in the present application contradicts or conflicts with a term in the incorporated reference, the term from the present application takes precedence over the conflicting term from the incorporated reference.

While the invention has been described with reference to several embodiments thereof, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiments disclosed as the best mode contemplated for carrying out this invention, but that the invention will include all embodiments falling within the scope of the appended claims.

What is claimed is:

1. A compressible thermally conductive sheet having a first and second heat transfer surface and a plurality of through holes connecting the first and second heat transfer surfaces to provide a thermal pathway there between, wherein the sheet comprises a polymeric foam pad having through holes that are filled with a non-foamed thermally conductive composition comprising thermally conductive particulate filler dispersed in a polymeric, matrix, wherein the particulate filler consists of a material selected from the group consisting of metal oxides, non-metal oxides, nitrides, carbides, borides and combinations thereof, wherein the filler has a thermal conductivity of about 0.5 W/m-K to about 1000 W/m-K;

wherein the compressible thermally conductive sheet has a thermal conductivity of at least 0.5 W/m-K;

wherein the density of the through holes is 100,000 holes per square meter to 2 million holes per square meter;

wherein the metal oxide is aluminum oxide, magnesium oxide, beryllium oxide, or combinations thereof; and wherein the non-foamed thermally conductive composition is free from filler particles comprising metal.

2. The compressible thermally-conductive sheet of claim 1 wherein the filler has a thermal conductivity of about 25 W/m-K to about 1000 W/m-K.

3. The compressible thermally-conductive sheet of claim 1 wherein the average thickness is 0.1 to 25 mm.

4. The compressible thermally-conductive sheet of claim 1 wherein the compression set is 1 to 10%.

5. The compressible thermally-conductive sheet of claim 1 wherein the compression force deflection is 1 to 20 psi.

6. The compressible thermally-conductive sheet of claim 1 wherein the sheet is 0.1 to 25 mm thick, the compression set is 1 to 5%, and the compression force deflection is 2 to 12 psi.

7. The compressible thermally-conductive sheet of claim 1 wherein the polymeric foam pad has a density of 6 to 25 pcf.

8. The compressible thermally-conductive sheet of claim 1 wherein the cells of the polymeric foam pad have average cell diameters of about 20 to about 500 micrometer.

9. The compressible thermally-conductive sheet of claim 1 wherein the foam pad comprises at least 60 percent polyurethane optionally blended with another polymer selected from the group consisting of silicone, polyolefin, polyester, polyamide, fluorinated polymer, polyalkylene oxide, polyvinyl alcohol, ionomer, cellulose acetate, polystyrene, and combinations thereof.

10. The compressible thermally-conductive sheet of claim 1 wherein the through holes have an average diameter of 0.3 mm to 5 mm.

11. The compressible thermally-conductive sheet of claim 1 wherein the through holes are generally cylindrical in shape and substantially perpendicular to the surfaces of the first and second heat transfer surfaces.

12. The compressible thermally-conductive sheet of claim 1 wherein the density of the through holes is 250,000 holes per square meter to 1,250,000 holes per square meter and wherein the through holes have an average diameter of 0.5 mm to 2 mm.

13. The compressible thermally-conductive sheet of claim 1 wherein the non-foamed thermally conductive composition comprises a heat cured silicone composition.

14. The compressible thermally-conductive sheet of claim 13 wherein the heat cured silicone comprises a two-part liquid silicone rubber or gel.

15. The compressible thermally-conductive sheet of claim 1 wherein non-foamed thermally conductive composition is the product of a process comprising filling the through holes with a precursor composition having a viscosity of less than 100,000 cps, as measured with a Brooks meter with no. 6 spindle and 2 rpm setting.

16. The compressible thermally-conductive sheet of claim 1 wherein the non-foamed thermally conductive composition comprises about 20% to 80% by weight of thermally conductive filler.

17. The compressible thermally-conductive sheet of claim 1 wherein the particulate filler is a ceramic.

18. The compressible thermally-conductive sheet of claim 1 wherein the non-foamed thermally conductive composition comprises boron nitride particles.

19. The compressible thermally-conductive sheet of claim 1 wherein the particles have thermal conductivity of 25 to 500 W/mK.

20. A thermal management assembly comprising the thermally conductive foam material of claim 1 disposed and compressed between a first heat transfer surface and a second heat transfer surface opposing said first heat transfer surface; wherein the thermally conductive foam material is compressed between the first and second heat transfer surfaces to provide a thermally-conductive pathway there between.

21. The assembly of claim 20 wherein one of the first or second heat transfer surfaces is located on a heat generating source.

22. The assembly of claim 20 wherein the heat-generating source is an electronic component and the other one of the first or second heat transfer surface is located on a thermal dissipation member.

23. The assembly of claim 22 wherein the thermal dissipation member is a heat sink or a circuit board.

24. A compressible thermally conductive sheet having a first and second heat transfer surface and a plurality of through holes substantially transverse to the first and second heat transfer surfaces to provide a thermal pathway there between;
   wherein said sheet comprises a foam polymeric pad having through holes that are filled with a non-foamed thermally conductive composition comprising about 20% to 80% by weight of dispersed thermally-conductive particulate filler, wherein the particulate filler consists of ceramic having on average a thermal conductivity of 25 to 500 W/m-K;
   wherein the particular filler is dispersed in a polymeric matrix comprising the reaction product of two silicone resins;
   wherein the thermally-conductive sheet exhibits a compression set of 1 to 10% and a compression force deflection of 1 to 20 psi; wherein the compressible thermally-conductive sheet has a thermal conductivity that is at least 0.75 W/m-K;
   wherein the density of the through holes is 100,000 holes per square meter to 2 million holes per square meter; and
   wherein the non-foamed thermally conductive composition is free from filler particles comprising metal.

25. A compressible thermally conductive sheet having a first and second heat transfer surface and a plurality of through holes substantially transverse to the first and second heat transfer surfaces to provide a thermal pathway there between;
   wherein said sheet comprises a foam polymeric pad having through holes that are filled with a non-foamed thermally conductive composition comprising about 20% to 80 by weight of dispersed thermally-conductive particulate boron nitride filler having on average a thermal conductivity of 25 to 500 W/m-K;
   wherein the particular filler is dispersed in a polymeric matrix comprising the reaction product of two silicone resins, wherein the cells of the polymeric foam pad have average cell diameters of about 20 to about 500 micrometer;
   wherein the thermally-conductive sheet exhibits a compression set of 1 to 10% and a compression force deflection of 1 to 20 psi;
   wherein the compressible thermally-conductive sheet has a thermal conductivity that is at least 0.75 W/m-K;
   wherein the density of the through holes is 100,000 holes per square meter to 2 million holes per square meter; and
   wherein the non-foamed thermally conductive composition is free from filler particles comprising metal.

\* \* \* \* \*